United States Patent
Kim et al.

(10) Patent No.: US 7,408,187 B2
(45) Date of Patent: Aug. 5, 2008

(54) LOW-VOLTAGE ORGANIC TRANSISTORS ON FLEXIBLE SUBSTRATES USING HIGH-GATE DIELECTRIC INSULATORS BY ROOM TEMPERATURE PROCESS

(75) Inventors: Il-Doo Kim, Seoul (KR); Yong Woo Choi, Lexington, MA (US); Harry L. Tuller, Wellesley, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 192 days.

(21) Appl. No.: 11/092,445

(22) Filed: Mar. 29, 2005

(65) Prior Publication Data
US 2006/0108579 A1    May 25, 2006

(51) Int. Cl.
*H01L 51/00*  (2006.01)

(52) U.S. Cl. .......................... 257/40; 257/66; 257/295; 257/411; 257/E29.272

(58) Field of Classification Search ........... 257/E29.272
See application file for complete search history.

(56) References Cited

U.S. PATENT DOCUMENTS

| | | | |
|---|---|---|---|
| 5,981,970 A | 11/1999 | Dimitrakopoulos et al. | |
| 6,114,088 A | 9/2000 | Wolk et al. | |
| 6,207,472 B1 | 3/2001 | Callegari et al. | |
| 6,482,527 B1 * | 11/2002 | Shrout et al. | 428/469 |
| 2001/0015438 A1 | 8/2001 | Callegari et al. | |
| 2004/0129937 A1 * | 7/2004 | Hirai | 257/40 |
| 2005/0001210 A1 * | 1/2005 | Lee et al. | 257/40 |
| 2005/0082523 A1 * | 4/2005 | Blanchet-Fincher et al. | 257/40 |
| 2005/0194640 A1 * | 9/2005 | Lazarev | 257/347 |

FOREIGN PATENT DOCUMENTS

| WO | WO 2004/087434 | 10/2004 |
|---|---|---|
| WO | WO 2005/004205 | 1/2005 |

OTHER PUBLICATIONS

Dimitrakopoulos et al., "Low-voltage organic transistors on plastic comprising high-dielectric constant gate inhibitors," Science, vol. 283, Feb. 5, 1999, pp. 822-824.

Velu et al., "Low driving voltages and memory effect in organic thin-film transistors with a ferroelectric gate insulator" Applied Physics Letters, vol. 79, No. 5 pp. 659-661, 2001.

* cited by examiner

*Primary Examiner*—Stephen W Smoot
(74) *Attorney, Agent, or Firm*—Gauthier & Connors LLP (57) ABSTRACT

A transistor device includes a transparent substrate. A high K dielectric is formed on the transparent substrate and transferred onto a flexible substrate. An organic transistor is formed on the high K dielectric.

19 Claims, 6 Drawing Sheets

LOW-VOLTAGE ORGANIC TRANSISTORS ON FLEXIBLE SUBSTRATES USING HIGH-GATE DIELECTRIC INSULATORS BY ROOM TEMPERATURE PROCESS

BACKGROUND OF THE INVENTION

The invention relates to the field of transistor circuits, and in particular to transistor circuits using organic semiconductors.

Transistor circuits using organic semiconductors (organic thin film transistors, OTFTs) have received intense interest for applications requiring structural flexibility, large area coverage, low temperature processing and especially low-cost. However, the operating voltage (20~100 V) is usually too high, especially for portable, battery-powered device applications. Instead of using parylene, which has dielectric constant of 3, the use of high dielectric constant insulators as gate dielectrics would result in much reduced operating voltages for organic transistors. The basic requirements for such dielectric materials include the formation of thin, pinhole-free films with high breakdown voltage, low leakage current density and good long-term stability.

While there have been some early promising results with the deposition and integration, at or near room temperature, of metal oxides such as $(Ba,Sr)TiO_3$ (BST) and $HfO_2$ with organic semiconductors such as pentacene, either their dielectric constants were not as high as desired and/or the films were electrically leaky.

SUMMARY OF THE INVENTION

According to one aspect of the invention, there is provided a low voltage operating transistor device that includes a plastic substrate. A high K dielectric is formed on the plastic substrate. An organic semiconductor is formed on the high K dielectric.

According to another aspect of the invention, there is provided a method of developing a transistor device. The method includes providing a transparent substrate. A high K dielectric is formed on the transparent substrate and transferred onto a flexible substrate. Also, the method includes and forming an organic substrate on the high K dielectric.

DETAILED DESCRIPTION OF THE INVENTION

The invention describes forming organic transistors having high K-dielectrics $Bi_{1.5}Zn_{1.0}Nb_{1.5}O_7$ (BZN series, $A_2B_2O_7$ pyrochlore structure materials), 0.1~5% Mg, Mn or Ni doped BST, or amorphous/nanocrystalline $CaCu_3Ti_4O_{12}$ (CCTO) thin films or hybrid structures composed of these materials such as BZN/CCTO, BZN/doped BST, doped BST/CCTO grown at near room temperature. Specifically, one can demonstrate performance by achieving relative dielectric constants of 50-55, factors of 3 greater than previous prior art results and low leakage current density less than $10^{-7}$ A/cm$^2$ at an applied voltage of 5 V. In a second approach, even higher values of relative dielectric constant can be achieved (e.g. $\epsilon_r$~150-200 for BZN and $\epsilon_r$>3000 for CCTO). Alternatively, the high K dielectrics mentioned above or others, such as BST ($\epsilon_r$~1000), can be grown at elevated temperatures on glass/transparent substrates and transferred to the flexible polymer substrate. Organic semiconductor layers are then deposited on top of the dielectric at room temperature.

The control of threshold voltage is very important in building circuit elements such as inverters, logic gates, and integrated amplifiers. If one can control the magnitude and sign of the threshold voltage of OTFTs, it becomes possible to fabricate both enhancement (E) and depletion (D) mode transistors. Circuit performance such as noise margin is much better in circuits with depletion load rather than enhancement load. In addition, one can fabricate many kinds of logic circuits with the combination of enhancement and depletion OTFTs.

The invention proposes a technique to change the threshold voltage of OTFTs. One can demonstrate that the deposition of very thin parylene films between the BZN films and the polymer semiconductor can be used to markedly shift the threshold voltage. By changing threshold voltage, depletion OTFTs as well as enhancement OTFTs can be made.

Bismuth zinc niobate ($Bi_{1.5}Zn_{1.0}Nb_{1.5}O_7$, $Bi_2(Zn_{1/3}Nb_{2/3})_2O_7$, $(Bi)_{1-2}(Zn,Nb,Ta,Ti)_2O_7$) (BZN) with the pyrochlore structure has a high permittivity (~170), low loss (<4× $10^{-4}$), and high resistivity (~3×10$^{13}$ Ωcm). BZN has been studied for microwave tunable devices, and films can be grown by physical deposition methods (sputtering and pulsed laser deposition) or by chemical deposition (chemical vapor deposition, atomic layer deposition, sol-gel process). In order to fabricate OTFTs (staggered and/or inverted staggered transistor configuration) using flexible polymer substrates such as, polyimide or polycarbonate, a low temperature BZN film growth process (room temperature or less than 200° C.) is required to protect the polymer substrate from high temperature deformation and degradation during dielectric gate growth. Generally, bulk Bi pyrochlores ($A_2B_2O_7$) require lower sintering temperatures, often below 950° C., than more common dielectrics based on the perovskite structure (e.g. $(Ba,Sr)TiO_3$).

Likewise, BZN films, with the cubic pyrochlore phase structure, tend to achieve good crystalline quality at much lower temperatures (e.g. typically 400° C.) than more common high K dielectrics based on the perovskite structure (e.g. $(Ba,Sr)TiO_3$).

Figure 1:
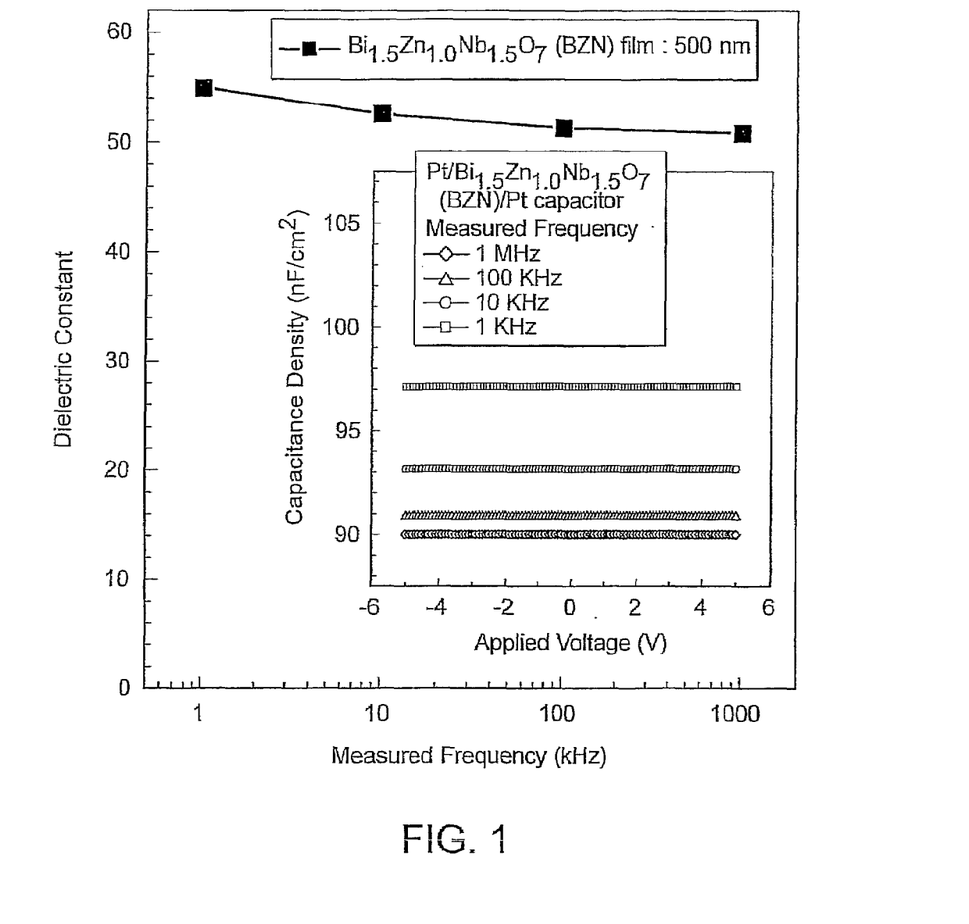
FIG. 1 is a graph illustrating the dielectric constant-frequency characteristics of BZN thin films grown on a Pt electrode at room temperature.

FIG. 1 shows the dielectric constant-frequency characteristics of BZN thin films grown on a Pt electrode at room temperature. The relative dielectric constant of the BZN thin film is nearly frequency independent, i.e. ~55-51 in the frequency range between 10$^3$ and 10$^6$ Hz. The inset in FIG. 1 shows capacitance-voltage characteristics at an applied frequency from 1 KHz to 1 MHz. The measured capacitance density for BZN films ranged from 97.2 to 90 nF/cm$^2$ at the applied frequency from 1 KHz to 1 MHz respectively. At an applied voltage of 5 V, no significant tunability was observed, which insures a voltage independent oxide capacitance. The low voltage dependence of the dielectric constant assures more predictable operation.

Figure 2:
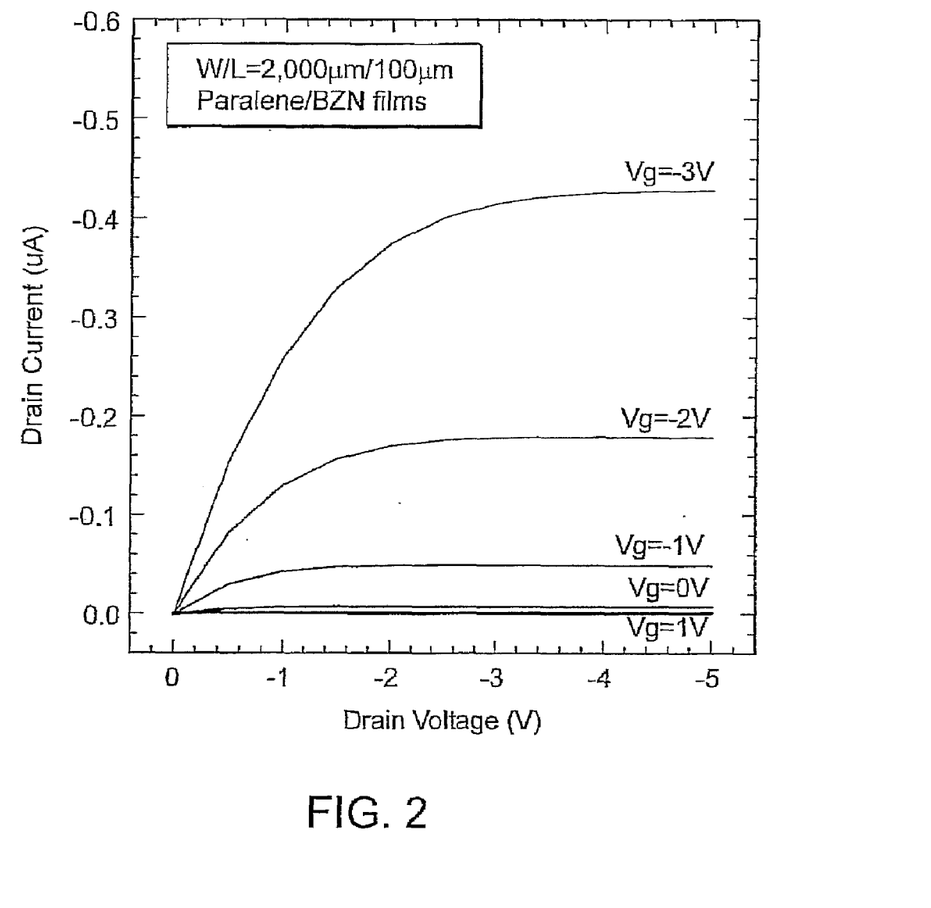
FIG. 2 is a graph illustrating the drain current as a function of the drain voltage of pentacene TFT with parylene/BZN gate dielectric.

One can also demonstrate that amorphous or nanocrystalline BZN films, obtained by a number of means including a) room-temperature deposition and/or b) low temperature (below 200° C.) deposition or c) annealing (below 200° C.) following room temperature deposition, exhibit good dielectric and current leakage characteristics and serve as excellent candidates for use as an OTFT gate-dielectric, as shown in FIG. 2.

$CaCu_3Ti_4O_{12}$ (CCTO), with amorphous and/or nanocrystalline structure, can be used as an OTFT gate dielectric. Recently, much attention has been paid to an unusual body-centered cubic (bcc) perovskite material CCTO. Single crystal and polycrystalline CCTO exhibit an extraordinarily high dielectric constant (values reported as high as 300,000) at room temperature. Some attribute the giant-dielectric phenomenon to a grain boundary (internal) barrier layer capacitance (IBLC) instead of an intrinsic property associated with the crystal structure. By room temperature and/or low temperature growth of CCTO films, one can expect to obtain nanosized crystalline or amorphous structures. High permittivity, with low leakage current, can be obtained by low temperature growth consistent with the stability requirements of OFETs using flexible polymer substrates.

Figure 3A:
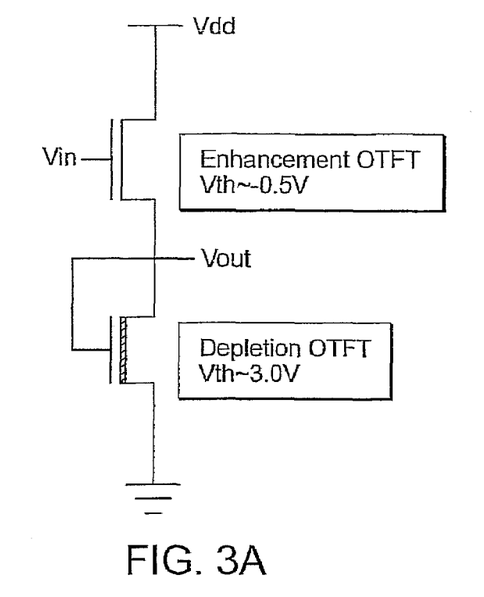
FIG. 3A illustrates a circuit diagram of the fabricated inverter with depletion load.
Figure 3B:
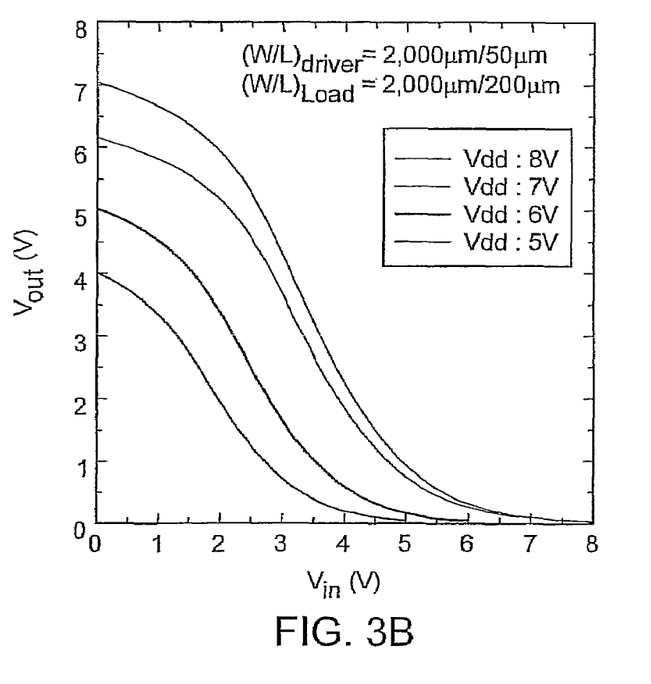
FIG. 3B illustrates a transfer curve of the inverters with the parylene/BZN stacked gate dielectric for enhancement OTFT and BZN only gate dielectric for depletion load OTFT.

FIGS. 3A-3B examine bilayer structures (inorganic/inorganic, organic/inorganic for example, parylene/BZN) which maintain a high effective dielectric constant while further improving leakage characteristics. Very thin organic dielectric films, e.g. parylene deposited on inorganic gate oxides such as room temperature deposited and/or post-annealed (<200° C.) BZN showed controllable threshold characteristics. The control of threshold voltage makes it possible to fabricate both enhancement (E) TFTs and depletion (D) TFTs. With both enhancement a depletion TFTs, it becomes possible to fabricate nearly any kind of digital logic circuit.

In order to demonstrate the logic circuits, we fabricated inverters with depletion load by using the enhancement and depletion OTFTs on the same substrate. The circuit diagram is illustrated in FIG. 3A-3B. FIG. 3B shows the transfer curves of the inverter with the as-deposited BZN film at various $V_{dd}$'s. The inverter operated at $V_{dd}$ of 4 V. The performance of the inverter improved as $V_{dd}$ increased. The following parameters were obtained at $V_{dd}$ of 8 V. Gain and switching voltage ($V_s$) were −2.1 and 3.1 V, respectively. Noise margin can be expressed with $V_{IL}$, $V_{OH}$, $V_{IH}$, and $V_{OL}$, which are the input and output voltages at the slope of the transfer curve of −1. $V_{IL}$ and $V_{OH}$ were 1.9 V and 6.0 V, respectively. $V_{IH}$ and $V_{OL}$ were 4.9 V and 1.0 V, respectively. We can span the output voltage from almost 0 V to $V_{dd}$ with depletion load. While the minimum output voltage ($V_{out}$) was ~0 V, maximum $V_{out}$ was ~7 V which was 1 V lower than $V_{dd}$.

Figure 4A:
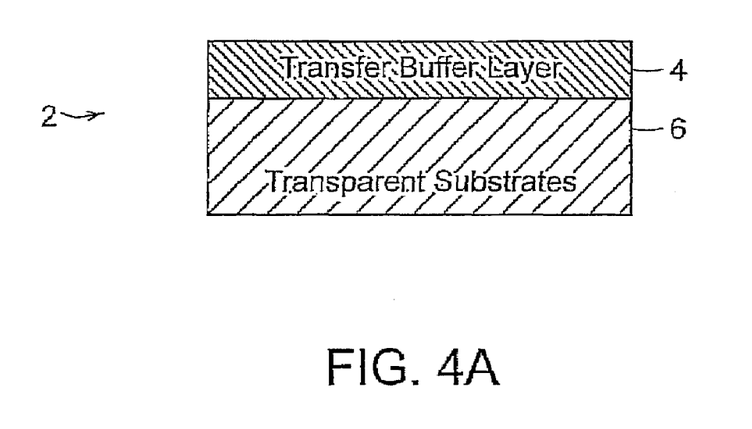
FIGS. 4A-4C illustrates a second embodiment of the invention.
Figure 4B:
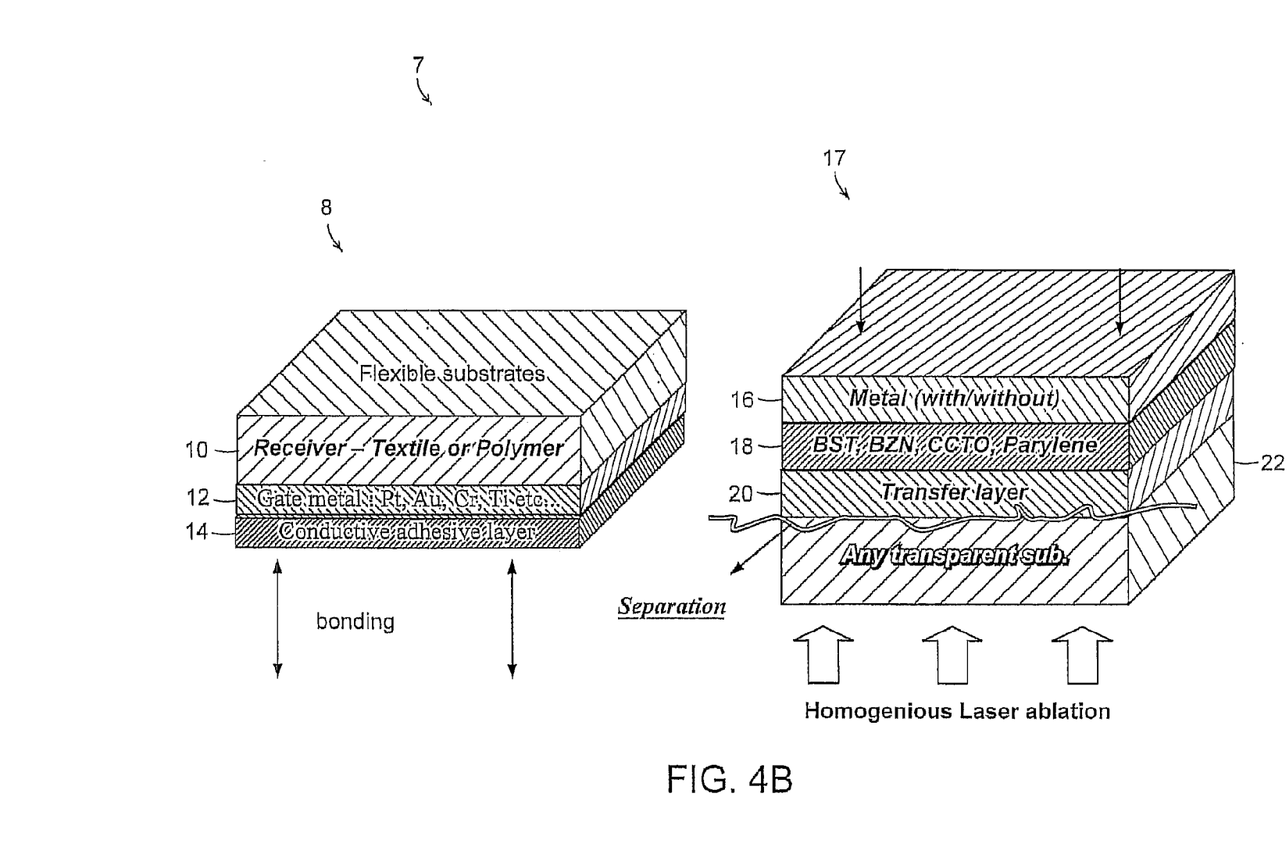
Figure 4C:
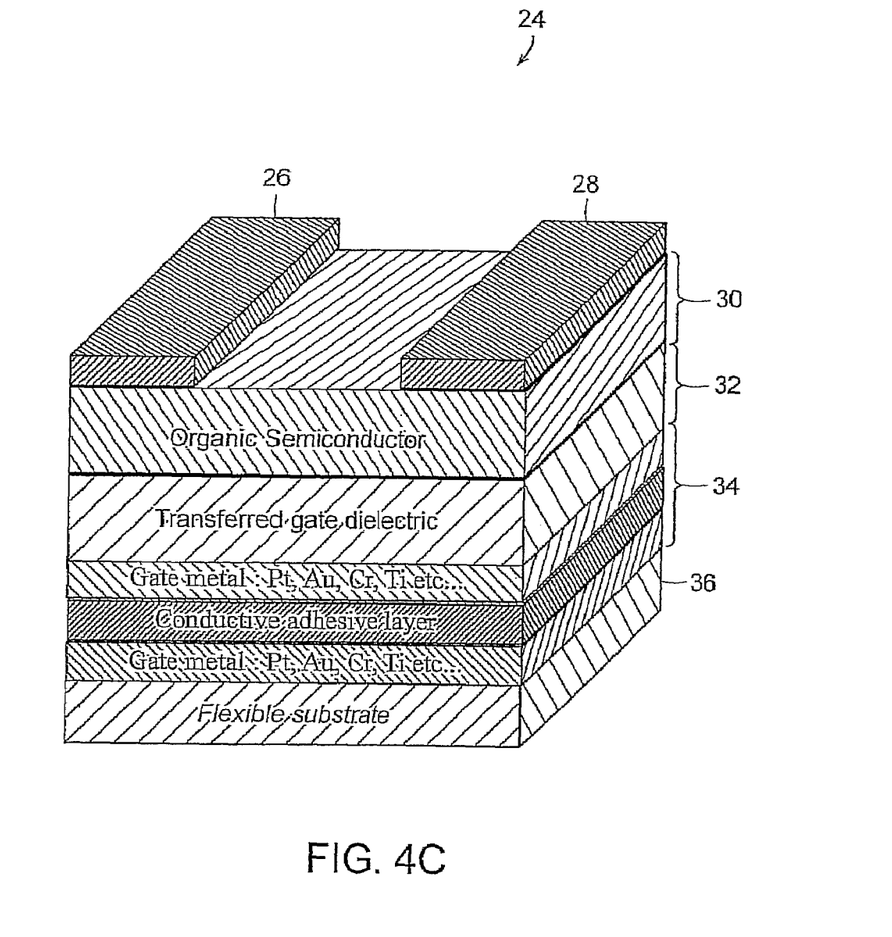

FIGS. 4A-4C illustrates a second approach 2 to the invention. FIG. 4A shows the growth of a transfer layer 4. The transfer layer 4 is formed by either deposition or growth on a transparent substrate 6. The transparent substrate 6 can be comprised of a single crystal such as quartz, MgO, $LaAlO_3$, $Al_2O_3$, YSZ or the like. The transfer layer 4 can be comprised of CCTO, BZN, $Pb(Zr,Ti)O_3$ or the like.

FIG. 4B shows the formation of an organic transistor 7. The organic transistor 7 includes a first structure 8 that includes a conductive adhesive layer 14, a gate metal 12 that is formed on the adhesive layer 14, and a receiver layer 10 that is formed on the gate metal 12. The receiver layer 14 can be comprised of a polymer or textile. The gate metal 12 can be comprised of Pt, Au, Cr, Ti, or the like. The structure 8 can be bonded unto another structure 17 that includes a transparent substrate 22, a transfer buffer layer 20 that is formed on the transparent substrate 22, and a BZT film 18 is formed on the transfer buffer layer 20, and a metal layer 16 is formed on the BZT film 18. Note the BZT film 18 can include other types of films such as BZN, CCTO, Parylene, or the like. Note the transparent substrate 22 has been ablated with a laser to form a flexible substrate. The metal layer 16 is comprised of Pt, Au, Cr, Ti, or the like, and is optional. The formation of the transfer layer 20 is similar the transfer layer 4 discussed in FIG. 4A.

FIG. 4C shows the fabrication of the transistor 24. The transistor 24 includes an organic semiconductor 30, gate dielectric 32, and gate metal 34. After the bonding of the structures 8 and 17 of FIG. 4B, the formation of the gate dielectric 32 includes the receiver layer 10 of structure 8. The gate metal 34 includes the gate metal layer 12 and adhesive layer 14 of structure 8 and the metal layer 16 of the structure 17. The flexible substrate 36 includes the BZT layer 18, transfer layer 20, and the ablated transparent layer 22 of the structure 17. Note the source 26 and drain 28 of the transistor is formed on the organic semiconductor 30.

This technique enables one to prepare the desired inorganic dielectrics at elevated temperatures thereby reaching even higher dielectric constants. The inorganic is then subsequently combined with the polymer layers at or near room temperature thereby protecting the stability of the organic transistor structure. CCTO and BZN are exemplary transfer materials. The CCTO and BZN films on the transfer layer are separated from the substrate by laser irradiation (i.e. KrF, XeCl excimer laser) which pass through the transparent substrate and is absorbed by the transfer layer.

CCTO and BZN can be grown at elevated temperatures on any transparent substrate such as single crystal MgO, $Al_2O_3$, $LaAlO_3$, YSZ, $MgAl_2O_4$ etc. and/or fused quartz. The dielectric constant and leakage current properties of transferred BZN and/or CCTO will be much better than those of BZN or CCTO deposited at room temperature. The dielectric constant of CCTO films can reach more than 2000.

Alternatively, one can also use hybrid structures, BZN/CCTO/transparent substrate, CCTO/BZN, Mg, Ni or Mn-doped BST/CCTO, Mg, Ni or Mn-doped BST/BZN etc. with many combinations possible. The important thing is that either CCTO or BZN itself can be used as a buffer layer for laser lift-off. After transfer of the oxide gate dielectric, one deposits thin parylene (many kinds of organic dielectrics are possible) to control threshold voltage. By either of two approaches, a room temperature process for combining high K dielectric inorganic films with polymers in organic FETs becomes possible.

Although the present invention has been shown and described with respect to several preferred embodiments thereof, various changes, omissions and additions to the form and detail thereof, may be made therein, without departing from the spirit and scope of the invention.

What is claimed is:

1. A transistor device comprising:
    a transparent substrate;
    a high K dielectric formed on said transparent substrate and transferred onto a flexible substrate, said high K dielectric comprises a combination of BZN, CCTO and Mg, Ni or Mn-doped BST;
    an organic substrate formed on said high K dielectric.

2. The transistor device of claim 1, wherein said high K dielectric comprises $Bi_{1.5}Zn_{1.0}Nb_{1.5}O_7$ (BZN), $Bi_2(Zn_{1/3}Nb_{2/3})_2O_7$, $(Bi)_{1-2}(Zn,Nb,Ta,Ti)_2O_7)$, $(Ca, Ba, Sr, Pb)_{1-2}(Zn, Nb, Ta, Ti, Zr)_2O_7$, and $(Ca_{1-x}Sr_x)Bi_4Ti_4O_{15}$.

3. The transistor device of claim 1, wherein a high K dielectric comprises $CaCu_3Ti_4O_{12}$ (CCTO) and between 0.1 and 5% Mg, Ni or Mn doped $(Ba,Sr)TiO_3$ (BST).

4. The transistor device of claim 1 further comprising organic films having a thin layer between 0.1 nm and 10 nm of parylene, HMDS, acrylate, or teflon on the BZN films and inorganic films having a thin layer between 0.1 nm and 10 nm of MgO, SiO$_2$, Si$_3$N$_4$, YSZ (yttrium-stabilized zirconia), CeO$_2$, Y$_2$O$_3$, Al$_2$O$_3$, HfO$_2$, SrTiO$_3$, LaAlO$_3$, or MgAl$_2$O$_4$ deposited on the BZN films to control threshold voltage and improve leakage current characteristics.

5. The transistor device of claim 1 further comprising a source that is formed on said organic substrate.

6. The transistor device of claim 1 further comprising a drain that is formed on said organic substrate.

7. A transistor device comprising:
a plastic substrate;
a high-K dielectric layer formed on said plastic substrate, said high K dielectric layer comprises a combination of BZN, CCTO and Mg, Ni or Mn-doped BST; and
an organic semiconductor layer formed on said high-K dielectric layer.

8. The transistor device of claim 7, wherein said high-K dielectric layer comprises at least one material selected from the group A$_2$B$_2$O$_7$ pyrochlore structure consisting of Bi$_{1.5}$Zn$_{1.0}$Nb$_{1.5}$O$_7$ (BZN), Bi$_2$(Zn$_{1/3}$Nb$_{2/3}$)$_2$O$_7$, (Bi)$_{1-2}$(Zn, Nb,Ta,Ti)$_2$O$_7$), (Ca, Ba, Sr, Pb)$_{1-2}$(Zn, Nb, Ta, Ti, Zr)$_2$O$_7$, and (Ca$_{1-x}$Sr$_x$)Bi$_4$Ti$_4$O$_{15}$.

9. The transistor device of claim 7, wherein said high-K dielectric layer comprises CaCu$_3$Ti$_4$O$_{12}$ (CCTO) and between 0.1 and 5% Mg, Ni or Mn doped (Ba,Sr)TiO$_3$ (BST).

10. The transistor device of claim 7, wherein said high-K dielectric layer comprises amorphous or nanocrystalline films formed by room temperature deposition or annealing below 200° C. following room temperature deposition.

11. The transistor device of claim 7 further comprising one or more organic films comprising a very thin layer between 0.1 nm and 10 nm of parylene, HMDS, acrylate, teflon on BZN films and inorganic films having a thin layer between 0.1 nm and 10 nm of MgO, SiO$_2$, Si$_3$N$_4$, YSZ (yttrium-stabilized zirconia), CeO$_2$, Y$_2$O$_3$, Al$_2$O$_3$, HfO$_2$, SrTiO$_3$, LaAlO$_3$, or MgAl$_2$O$_4$ deposited on the BZN films to control threshold voltage and improve leakage current characteristics.

12. The transistor device of claim 7, wherein said organic semiconductor comprises pentacene, polymer semiconductor.

13. The transistor device of claim 7 further comprising a source, drain, gate that is formed on said plastic substrate.

14. A transistor device comprising:
a glass or transparent substrate;
a transfer layer disposed over the glass/transparent substrate;
a high-K dielectric layer disposed over the transfer layer, said high K dielectric layer comprises a combination of BZN, CCTO and Mg, Ni or Mn-doped BST;
a high-K dielectric layer including transfer layer transferred onto a receiver flexible polymer substrate; and
an organic semiconductor layer formed on the transferred high-K dielectric layer.

15. The transistor device of claim 14, wherein said glass or transparent substrate comprises transparent substrate such as glass, quartz, MgO, LaAlO$_3$, Al$_2$O$_3$, YSZ which can be stable about 600° C.

16. The transistor device of claim 14, wherein said transfer layer comprises thin CCTO, BZN, or Pb(Zr,Ti)O$_3$.

17. The transistor device of claim 14, wherein said high-K dielectric layer comprises A$_2$B$_2$O$_7$ pyrochlore structured Bi$_{1.5}$Zn$_{1.0}$Nb$_{1.5}$O$_7$ (BZN), Bi$_2$(Zn$_{1/3}$Nb$_{2/3}$)$_2$O$_7$, (Bi)$_{1-2}$(Zn, Nb,Ta,Ti)$_2$O$_7$), (Ca, Ba, Sr, Pb)$_{1-2}$(Zn, Nb, Ta, Ti, Zr)$_2$O$_7$, and (Ca$_{1-x}$Sr$_x$)Bi$_4$Ti$_4$O$_{15}$ (CCTO).

18. The transistor device of claim 14, wherein said high-K dielectric layer on the transfer layer is separated from the transparent substrate by laser irradiation which passes through the transparent substrate and is absorbed by the transfer layer.

19. The transistor device of claim 14, wherein said transferred high-K dielectric layer is attached to receiver flexible polymer substrate by adhesive tape or layer.

* * * * *

UNITED STATES PATENT AND TRADEMARK OFFICE
CERTIFICATE OF CORRECTION

| | | |
|---|---|---|
| PATENT NO. | : 7,408,187 B2 | Page 1 of 1 |
| APPLICATION NO. | : 11/092445 | |
| DATED | : August 5, 2008 | |
| INVENTOR(S) | : Kim et al. | |

It is certified that error appears in the above-identified patent and that said Letters Patent is hereby corrected as shown below:

Title Page 1, Line 25, please insert

Item -- Related U.S. Application Data (60) Provisional application No. 60/629,621 filed on November 19, 2004. --

Signed and Sealed this
Twelfth Day of April, 2011

David J. Kappos
*Director of the United States Patent and Trademark Office*